US 6,736,657 B2
(12) United States Patent
Bonn

(10) Patent No.: US 6,736,657 B2
(45) Date of Patent: May 18, 2004

(54) DEVICE FOR TRANSMITTING ELECTRIC CURRENT BETWEEN TWO COMPONENTS OF A STEERING DEVICE FOR MOTOR VEHICLES

(75) Inventor: Helmut Bonn, Haibach (DE)

(73) Assignee: Takata-Petri AG, Aschaffenburg (DE)

( * ) Notice: Subject to any disclaimer, the term of this patent is extended or adjusted under 35 U.S.C. 154(b) by 25 days.

(21) Appl. No.: 10/204,713

(22) PCT Filed: Feb. 26, 2001

(86) PCT No.: PCT/DE01/00776

§ 371 (c)(1),
(2), (4) Date: Nov. 15, 2002

(87) PCT Pub. No.: WO01/62551

PCT Pub. Date: Aug. 30, 2001

(65) Prior Publication Data

US 2003/0094955 A1 May 22, 2003

(30) Foreign Application Priority Data

Feb. 24, 2000 (DE) ..................... 200 03 965 U

(51) Int. Cl.$^7$ ............................................. H01R 35/04
(52) U.S. Cl. ....................................................... 439/164
(58) Field of Search .................... 439/164, 15

(56) References Cited

U.S. PATENT DOCUMENTS

| 4,149,026 | A |   | 4/1979  | Fritz et al.    |            |
|-----------|---|---|---------|-----------------|------------|
| 4,367,585 | A |   | 1/1983  | Elliott et al.  |            |
| 4,978,191 | A |   | 12/1990 | Hasegawa et al. |            |
| 5,102,061 | A |   | 4/1992  | Suzuki et al.   |            |
| 5,833,477 | A |   | 11/1998 | Zahn            |            |
| 5,888,084 | A |   | 3/1999  | Mukai et al.    |            |
| 6,410,909 | B1| * | 6/2002  | Rudolph et al.  | 250/231.13 |
| 6,416,355 | B1| * | 7/2002  | Liao            | 439/501    |
| 6,421,044 | B2| * | 7/2002  | Murphy          | 345/163    |
| 6,471,529 | B2| * | 10/2002 | Oishi           | 439/164    |
| 6,501,034 | B2| * | 12/2002 | Sugata          | 200/61.54  |

FOREIGN PATENT DOCUMENTS

| DE | 40 04 233 A1 | 8/1990 |
| DE | 41 11 699 A1 | 2/1992 |

(List continued on next page.)

OTHER PUBLICATIONS

Gerhard Moosburger, "Leiterplatten–Kompendium" (circuit board compendium), *Elektronik*, 23:136–141 (1991), Leiterplattenfertigung Grundlagen, Germany.

(List continued on next page.)

*Primary Examiner*—Gary Paumen
(74) *Attorney, Agent, or Firm*—Foley & Lardner

(57) ABSTRACT

The invention relates to a device for transmitting electric current between two components, which twist in relation to one another, of a steering device for motor vehicles. The inventive device comprises a rotor which is assigned to the steering wheel and which can turn together with the same, a stator which is assigned to a stationary subassembly of the motor vehicle, and at least one flexible printed circuit board which runs from the rotor to the stator. When the steering wheel is turned, said printed circuit board can, according to the direction of turning, be wound onto a winding element or unwound therefrom. In addition, the printed circuit board comprises a flat flexible support on which the conductor tracks run from the stator to the rotor. According to the invention, each opposing surface (28, 29) of the flexible support (30) is provided with conductor tracks (40a, 40b) running from the stator to the rotor.

35 Claims, 8 Drawing Sheets

FOREIGN PATENT DOCUMENTS

| | | |
|---|---|---|
| DE | 40 27 952 A1 | 3/1992 |
| DE | 195 25 928 C2 | 1/1997 |
| DE | 197 34 527 A1 | 2/1998 |
| DE | 196 49 906 A1 | 6/1998 |
| EP | 0 166 418 A2 | 1/1986 |
| EP | 0 482 937 A2 | 4/1992 |
| EP | 0 775 611 A2 | 5/1997 |
| EP | 0 809 580 B1 | 12/1997 |
| EP | 0 913 319 A2 | 5/1999 |
| GB | 2 164 506 A | 3/1986 |
| JP | 61-164926 | 7/1986 |
| JP | 05-58230 | 3/1993 |
| JP | 06-351126 | 12/1994 |
| JP | 07-231550 | 8/1995 |
| JP | 09-129283 | 5/1997 |
| JP | 11-168279 | 6/1999 |
| JP | 11-196526 | 7/1999 |
| JP | 11-204898 | 7/1999 |
| JP | 05-58230 | 9/1999 |
| JP | 11-329629 | 11/1999 |
| JP | 2000-021535 | 1/2000 |

OTHER PUBLICATIONS

Horst Kober; "Flexibel verdrahten auf kleinstem Raum" (flexible wiring in minimun space), *Leiterplattentechnik*, 104(5):356–359 (1996), Carl Hanser Verlag, München, Germany.

* cited by examiner

Detail B

Fig. 3b
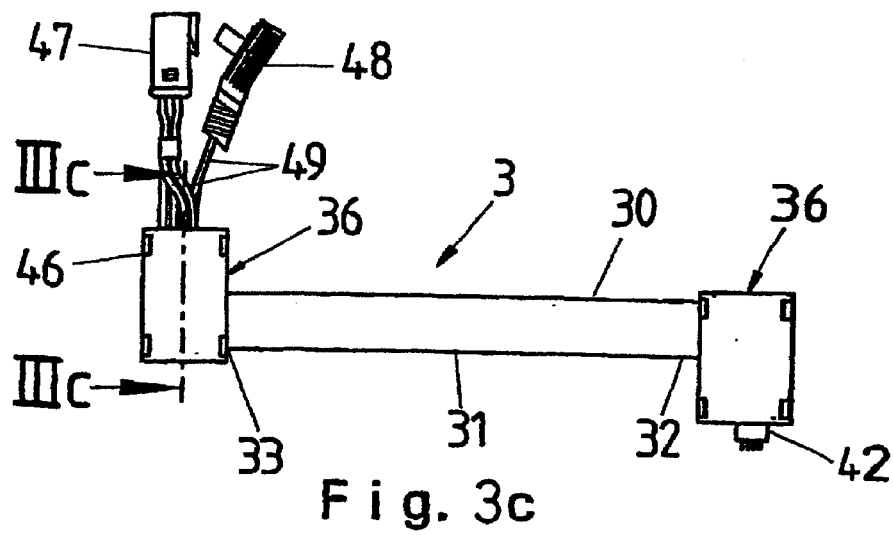
Fig. 3c
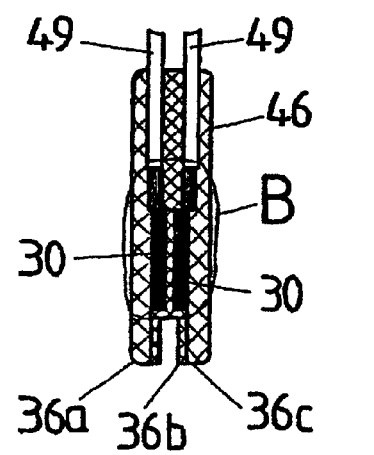
Detail B
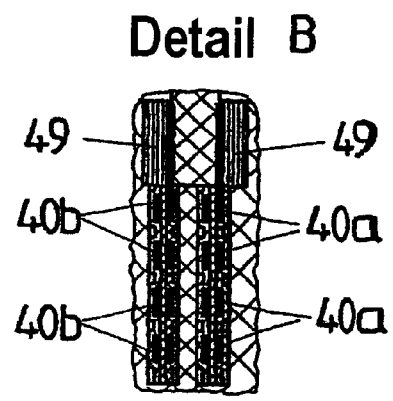
Fig. 3d
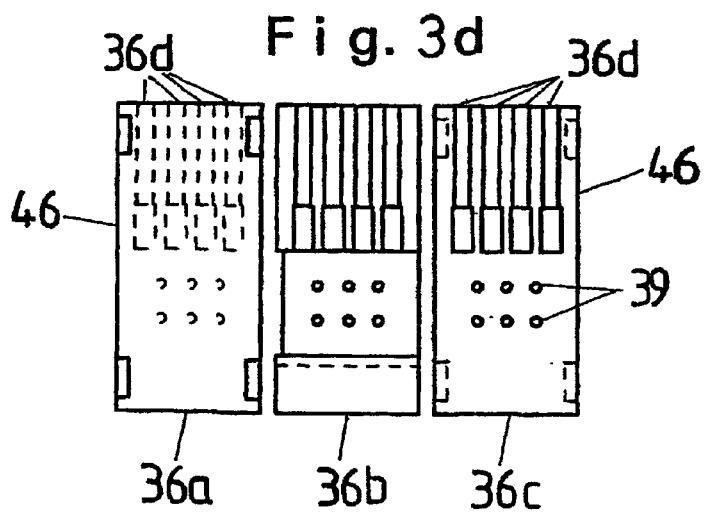

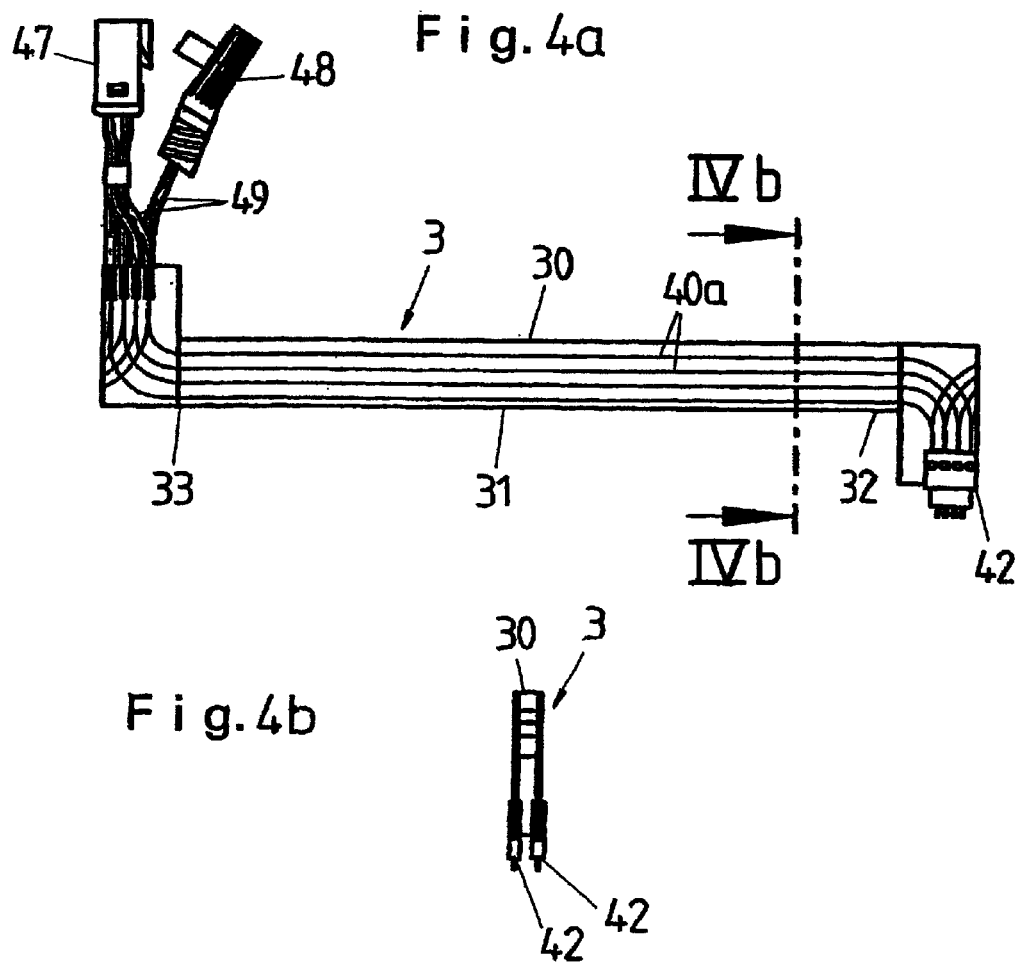

DEVICE FOR TRANSMITTING ELECTRIC CURRENT BETWEEN TWO COMPONENTS OF A STEERING DEVICE FOR MOTOR VEHICLES

BACKGROUND OF THE INVENTION

The invention relates to a device for transmitting electric current between two components, which can rotate with respect to one another, of a steering device for motor vehicles.

Apparatuses such as these are used for transmitting electric current (in particular signal current and/or power current) from the vehicle electronics (which are arranged fixed to the bodywork) of a motor vehicle to the steering wheel, and vice versa. This allows electrical or electronic functional elements which are provided on the steering wheel, such as the trigger for the gas generator of an airbag unit, steering wheel heating or electrical switches for operating indicator lights, windshield wipers or a radio, to be integrated in the steering wheel and to be supplied with current from the vehicle electronics.

A device such as this for transmitting electric current is known from DE 41 11 699. This device has a rotor which is associated with the steering wheel and can rotate together with it, as well as a stator which is associated with an assembly whose position is fixed with respect to the rotary movement of the steering wheel, for example the steering column cladding of the steering device. The rotor and the stator are connected to one another by means of a flexible electrical conductor, which is in the form of a strip-like printed circuit. This flexible electrical conductor is rolled up on or unrolled from an intermediate panel, which is formed between the rotor and the stator, depending on the rotation direction of the rotor.

SUMMARY OF THE INVENTION

In the known apparatus, the number of individual conductor tracks in the printed circuit on the flexible conductor is restricted by its dimensions. If more conductor tracks are required, then either a larger flexible conductor or a number of conductors must be used. In both cases, this leads to an increased amount of space being required for the flexible conductor in the apparatus.

One object of the invention is to provide a device for transmitting electric current which provides a great a number of conductor tracks for current transmission as possible, while requiring little space.

According to an embodiment of the invention, an apparatus for transmitting electric current between two components (a stator and a rotor), which can rotate with respect to one another is provided.

According to this embodiment, the flexible conductor which runs from the stator to the rotor is in the form of a flexible printed circuit. When the steering wheel is rotated, this flexible printed circuit can be wound up onto or unwound from a winding element, and has a flat flexible substrate, on whose front face and rear face conductor tracks run from the stator to the rotor.

As a flexible substrate, a flexible printed circuit such as this has, for example, an electrically insulating substrate film which is provided with a number of metallic conductor tracks on both sides, with the conductor tracks being covered by insulator films.

In order to produce the desired conductor track design, areas of the thin metal layers which are not required in this case on the front face and rear face of the flexible substrate film are removed, for example by a photolithographic and etching technique, so that the desired individual conductor tracks are produced.

The use on both sides of at least one substrate film as a flexible printed circuit thus makes it possible, in a simple manner, to double the surface area to which the desired circuit and conductor track design can be applied.

Furthermore, in addition to transmitting current, the flexible printed circuit can also carry out other functions, by integrating further electrical or electronic components in the printed circuit. This reduces not only the number of separate electrical and electronic components in the area of the steering device, but also the space that they require. Thus, in addition to transmitting electrical signals from the stator to the rotor, a single printed circuit can also carry out a large number of additional functions.

The flexible printed circuit has in each case at least one associated electrical connection on the stator and on the rotor, with the flexible printed circuit having electrical contact elements, which can make electrical contact with these connections, at its stator end and at its rotor end. Said contact elements are preferably in the form of plug elements, which can be inserted into the corresponding electrical connections on the stator and on the rotor, and are connected to the conductor tracks on the flexible substrate by means of electrical lines.

The contact elements for the flexible printed circuit may in this case be provided both for making contact with electrical connections which are arranged essentially transversely with respect to the direction in which the flexible printed circuit extends and for making contact with electrical connections which are arranged essentially parallel to the flexible printed circuit.

If a large number of conductor tracks are required between the stator and the rotor, then it is advantageous to design the conductor tracks (which, for example, are produced by printing a metal layer on both sides of the flexible substrate film, followed by selective etching) such that the distance between the individual conductor tracks is greater in the region of the rotor end and/or of the stator end of the printed circuit than in the central section of the printed circuit. This allows the central section of the flexible printed circuit, which is wound up and unwound during rotation of the steering wheel, to be made particularly narrow. The flexible printed circuit then broadens out at both of its ends, so that the individual conductor tracks there can be arranged further apart from one another, thus making it easier to make electrical contact with the individual conductor tracks.

It is also advantageous for the flexible printed circuit to have reinforcing elements at its stator end and/or at its rotor end, in particular in the region of its electrical contact elements, in order to give it robustness. These reinforcing elements may be formed, in particular, by plastic elements, which are molded or clipped onto the flexible printed circuit. FR4 boards are particularly suitable for use as reinforcing elements, which specifically support the flexible substrate of the printed circuit, which is preferably composed of polyester or polyimide.

The flexible printed circuit preferably has means to ensure strain relief for the electrical contact between the electrical lines and the conductor tracks on the flexible substrate film of the printed circuit. By way of example, the reinforced regions may have a holding section which has a number of guide cutouts, into which the electrical lines fit and can be connected with a force fit to the reinforcing elements.

In order to simplify the installation of said electrical contacts, it is advantageous for the reinforcing elements to comprise at least two individual elements, which are in the form of small panels, are essentially of the same size, and can be joined together such that the flexible printed circuit and the electrical lines that are supplied to it are enclosed.

The individual elements can be attached to one another at the joint edges by means of film hinges, so that the flexible printed circuit and the electrical contact elements can be enclosed by the individual elements in a simple manner, by means of a folding mechanism.

The flexible printed circuit can either be connected to the stator and to the rotor, respectively, at its ends via latching elements, or else can be adhesively bonded to the stator and to the rotor, respectively. The connection is in this case advantageously provided via said reinforcing elements.

A further embodiment of the invention has a broad rotor end and/or stator end on the flexible printed circuit, with the conductor tracks which run on the front face and rear face of the flexible printed circuit ending in regions which are arranged alongside one another on the flexible printed circuit. Electrical contact elements can thus be attached to each of these conductor track ends without there being any risk of a short circuit between the conductor tracks on the front face and rear face of the flexible conductor during the contact-making process. The rotor end and/or stator end of the flexible printed circuit can be folded such that the electrical contact elements for the conductor tracks come to rest alongside one another transversely with respect to the direction in which the printed circuit extends, and thus form a compact electrical contact element.

The flexible printed circuit can also be provided with increased strength and robustness by providing it with a plastic sheath, at least in places.

A further major advantage of the solution according to the invention is that further electronic assemblies can be integrated in the flexible printed circuit, in particular at one of its ends.

For example, a steering angle sensor, whose electronic evaluation unit is integrated in the flexible circuit, can be provided at the stator end of the flexible printed circuit. An electronics unit can be integrated in the rotor end of the flexible printed circuit, coupled to multifunction switches which are arranged on the steering wheel, or to electrical components on the steering wheel side, such as a triggering apparatus for an airbag.

If steering wheel heating is provided, then the control electronics for the steering wheel heating can preferably be integrated in the flexible printed circuit.

The flexible printed circuit also allows coded signals to be transmitted, in which case the signals can be coded and/or decoded, by way of example, by means of integrated circuits on the printed circuit itself.

With regard to the geometric configuration of the device according to the invention, it is advantageous for the stator and the rotor to form an inner and an outer housing element, of which housing elements one surrounds the other in an annular shape, and which can rotate with respect to one another, preferably with the stator surrounding the rotor. The winding element which is provided for holding the flexible printed circuit is either in the form of a component of the rotor, or in the form of a winding segment which can rotate freely. A holder for the flexible printed circuit is thereby formed between the stator and the rotor.

In another embodiment of the present invention, the flexible printed circuit has at least one section on which the direction in which the flexible printed circuit extends is reversed with respect to the circumference of the arrangement. This means that, starting from one end (for example the stator end) of the flexible printed circuit, the flexible printed circuit first of all runs along a first circumferential direction (that is to say in the clockwise sense or in the counterclockwise sense, depending on the nature of the winding) until it reaches said section, at which point the direction in which it extends is reversed (with respect to the clockwise sense).

The reversing section of the flexible printed circuit is essentially U-shaped, and the flexible printed circuit is guided between the stator and the rotor by means of a guide ring, which supports the U-shaped section of the flexible printed circuit. The guide ring forms, between the stator and the rotor, a holder for that part of the flexible printed circuit which is wound up on the winding element, and a further holder for that part of the flexible printed circuit which has been unwound from the winding element.

If the winding element of the device is in the form of a moving winding segment, it is also possible for the winding segment to have a number of U-shaped passages, so that a number of flexible printed circuits can be wound up and unwound one behind the other.

Such an arrangement of a stator, a rotor and the associated electrical conductors is described in principle in EP 0 556 779 A1, DE 195 06 865 C1 and DE 197 34 527 A1, which are referred to here. These embodiments of the invention have the advantage that a comparatively short length of flexible printed circuit is required for the rotation of the steering wheel, and hence of the rotor.

A further embodiment of the invention provides a stator that is intended to hold a control switch, for example for an indicator light switch, with which an electronic assembly on the flexible printed circuit is associated. The control switch may be inserted, in particular, into a holder provided for this purpose in the stator. The printed circuit then forms not only an electronic control unit for components which are supplied with current via the flexible printed circuit, but also for those electrical components, such as an indicator light switch, which are provided on the stator and are supplied with current via separate supply lines for the vehicle electronics.

Further advantages of the invention will become clear from the following description of the exemplary embodiments, with reference to the drawings, in which:

BRIEF DESCRIPTION OF THE DRAWINGS

FIG. 1b shows a plan view of a section of the stator from FIG. 1a;

FIG. 1c shows a cross section in the central region of a flexible printed circuit for transmitting electric current between two components, which can rotate with respect to one another, of a steering device for motor vehicles, which is used in a device as shown in FIG. 1a;

FIG. 2a shows a plan view of a further embodiment of a device for transmitting electric current as shown in FIG. 1a;

FIG. 2b shows a partial view of the device based on the orientation IIb in FIG. 2a;

FIG. 2c shows a section through the device along the line IIc—IIc in FIG. 2a;

FIG. 3a shows a plan view of one embodiment of the flexible printed circuit shown in FIG. 1a;

FIG. 3b shows a plan view of a second embodiment of the flexible printed circuit shown in FIG. 1a;

FIG. 3c shows a section through the flexible printed circuit shown in FIG. 3b, in the region of its rotor-end reinforcing element;

FIG. 3d shows a plan view of three individual components of the rotor-end reinforcing element shown in FIGS. 3b and 3c;

FIG. 4a shows a plan view of a third embodiment of the flexible printed circuit shown in FIG. 1a;

FIG. 4b shows a section through the flexible printed circuit along the line IVb—IVb shown in FIG. 4a, in the region of the stator end;

FIG. 5a shows a plan view of a fourth embodiment of the flexible printed circuit shown in FIG. 1a;

FIG. 5b shows an enlarged section through the flexible printed circuit, along the line Vb—Vb shown in FIG. 5a;

FIG. 6 shows a plan view of a fifth embodiment of the flexible printed circuit shown in FIG. 1a;

FIG. 7 shows a plan view of a sixth embodiment of the flexible printed circuit shown in FIG. 1a.

DETAILED DESCRIPTION

Figure 1A:
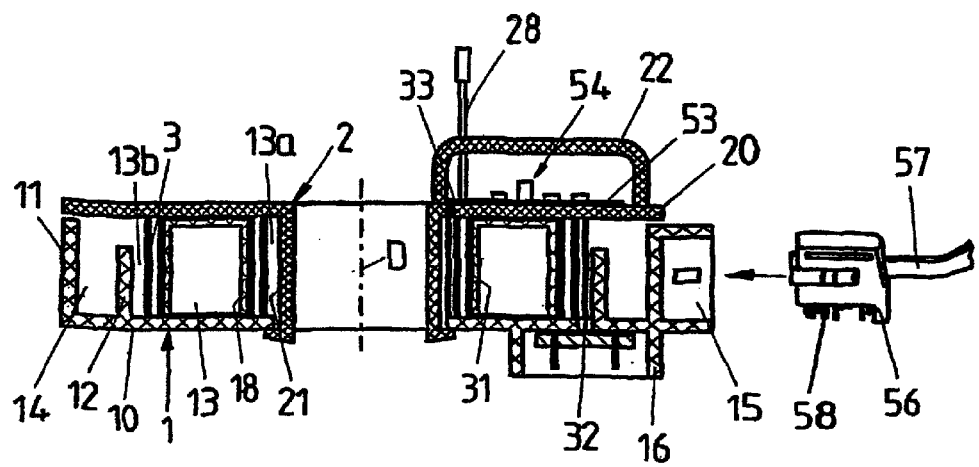
FIG. 1a shows a cross section of a device for transmitting electric current between two components, which can rotate with respect to one another, of a steering device for motor vehicles, having a stator and a rotor which are connected to one another via a flexible printed circuit.
Figure 1B:
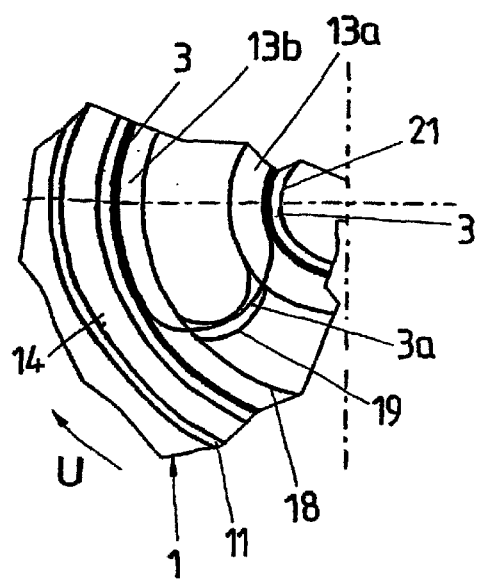

FIG. 1a shows a cross section through a device for transmitting electric current between two components, which can rotate with respect to one another, of a steering device for motor vehicles, having a stator 1 which is associated with a stationary assembly in the vehicle and, in particular, can be mounted on stationary steering column cladding for the steering device, and having a rotor 2 which is associated with the steering wheel and can rotate together with the steering wheel about the rotation axis D. In addition, FIG. 1b shows a plan view of a section of the stator 1.

The stator 1, which is rotationally symmetrical about the rotation axis D, has a base surface 10 which extends at right angles to the rotation axis D, and from which an outer wall 11, an intermediate wall 12, which is offset radially inward from the outer wall 11, and a guide ring 18, which has a rectangular cross section and is offset even further inward, project. In one section, the outer wall 11 has a holder 15 for an indicator light switch 56, which can be released via an operating lever 57 and can be connected to the indicator lights of the motor vehicle via an electrical plug element 58.

The base surface 10 and the outer wall 11 of the stator 1 form a housing, which surrounds the rotor 2 in an annular shape. The rotor 2 likewise has a base surface 20, which runs at right angles to the rotation axis D, is opposite the base surface 10 of the stator 1, and from which a winding surface 21 for a flexible printed circuit 3 projects at right angles. The base surface 20 of the rotor 2 has a cover 22 in one section, which forms a housing.

A chamber 13 is formed between the base surface 10 and the intermediate wall 12 of the stator 1 on the one hand and the base surface 20 as well as the winding surface 21 of the rotor 2 on the other hand, and is used to hold the central section 31 of a flexible printed circuit 3, which extends from the stator 1 to the rotor 2. Radially on the outside beyond the intermediate wall 12, this chamber 13 is connected to a further chamber 14, which is used to hold assemblies for determining the rotation angle of the rotor 2 with respect to the stator 1.

The stator end 32 of the printed circuit 3 is in the form of a plug element (see FIGS. 2a–4, and is arranged in a plug holder 16 in the stator 1. The rotor end 33 of the flexible printed circuit 3 is likewise in the form of a plug element (see FIGS. 2a–4), and is provided under the cover 22 of the rotor 2. A projection 53 can also be seen at the rotor end 33 of the flexible printed circuit 3 in FIG. 1a, and this projection 53 has a number of electrical components of an electronic control unit 54. Further details relating to this will be explained in the following text, with reference to FIG. 3.

The flexible printed circuit 3 is used for transmitting electric current (that is to say both for transmitting signal current and for transmitting power current) from the stator 1 to the rotor 2 or vice versa. In consequence, electrical assemblies which are provided on a steering wheel, for example the trigger apparatus for the gas generator for an airbag unit or a multifunction switch for operating electrical functional units of the motor vehicle, can be connected via the rotor 2, the flexible printed circuit 3 and the stator 1 to the vehicle electronics, which are arranged such that they are stationary.

The use of a stator, of a rotor and of a flexible line for transmitting electrical signals between two assemblies, which can rotate with respect to one another, of a steering device for motor vehicles is known in principle. By way of example, reference should therefore be made to DE 41 11 699 and DE 195 25 928 C2 for further details relating to this.

Figure 1C:
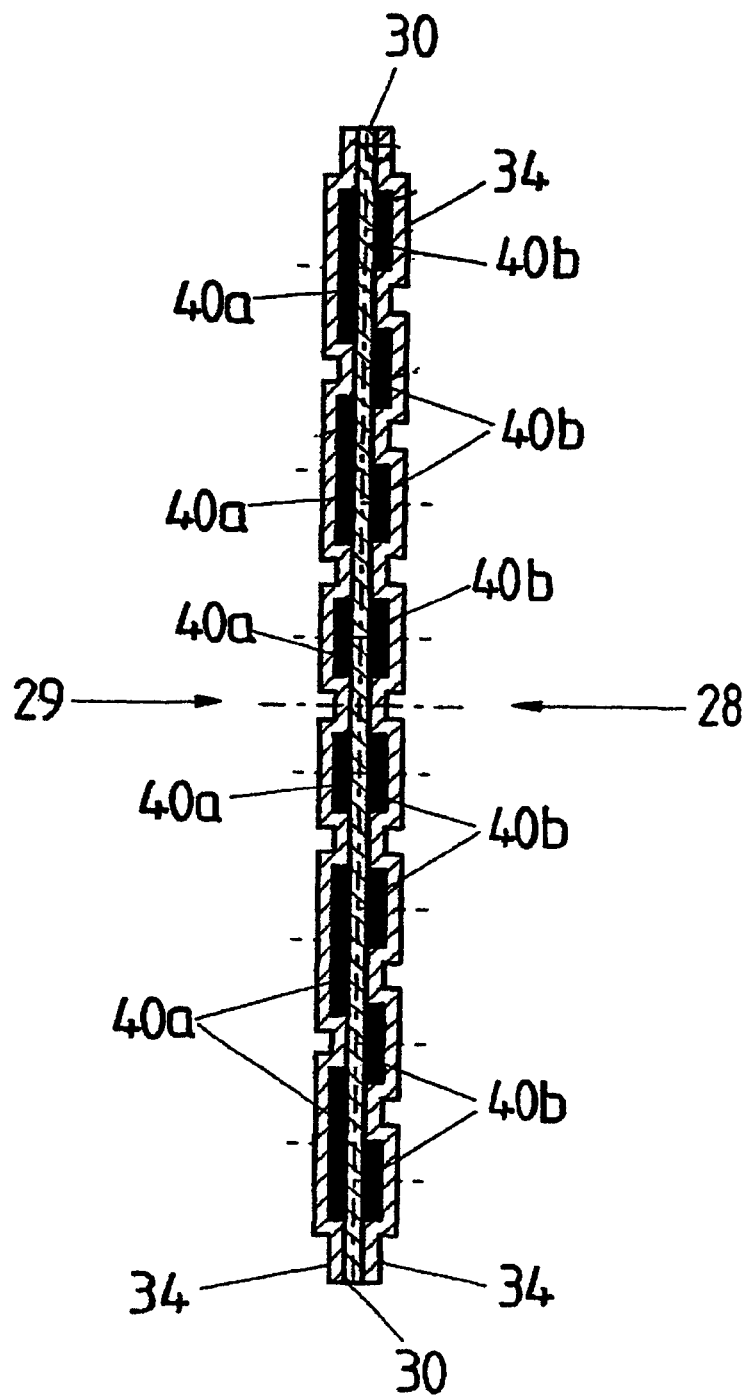

FIG. 1c shows a cross section through the central region of a flexible printed circuit 3 for transmitting signal and/or power current between the two components, which can rotate with respect to one another, of a steering device for motor vehicles. As can be seen, the flexible printed circuit 3 is formed in layers between the stator end and the rotor end along the direction in which the flexible printed circuit 3 extends, with the central layer being formed by a flexible substrate film 30, which has conductor tracks 40a, 40b on both sides, which conductor tracks 40a, 40b are composed of thin metal layers and are each covered by insulating film 34.

As can also be seen, the cross sections of the conductor tracks 40a, 40b are each of different size, depending on the required current level.

The present invention is distinguished from known devices for transmitting electric current in that a flexible printed circuit 3 is used to connect the stator 1 and the rotor 2, which flexible printed circuit 3 is in the form of a flat flexible substrate 30, which is provided with conductor tracks 40a, 40b on each of two surfaces 28, 29, which face away from one another.

A large number of other functions (in addition to the transmission of signal and/or power current) can also be integrated in a flexible printed circuit such as this. Further details relating to this will be described in the following text with reference to FIGS. 2a to 4.

First of all, it should also be mentioned that the use of a flexible printed circuit is particularly advantageous for a geometric arrangement of a stator, rotor and printed circuit in which the flexible printed circuit 3 has a U-shaped section 3a, on which the direction in which the flexible printed circuit 3 extends is reversed with respect to the clockwise sense. A geometric arrangement such as this minimizes the required length for the flexible printed circuit 3.

This arrangement of the flexible printed circuit is made possible in the present case by providing a guide ring 18 for the flexible printed circuit 3 in the inner chamber 13 of the arrangement, which guide ring 18 has an essentially U-shaped passage 19 for holding and for supporting the U-shaped section 3a of the flexible printed circuit 3. The guide ring 18 forms, in the inner chamber 13, a holder 13a for that part of the flexible printed circuit 3 which is wound up on the winding surface 21, and a further holder 13b for that part of the printed circuit 3 which is unwound from the winding surface 21.

Further details relating to an expedient geometric configuration of the stator 1, rotor 2 and of a flexible line running between these two components, with regard to minimizing the length of this line, can be found in EP 0 556 779 A1, DE 195 06 865 C1 and DE 197 34 527 A1.

Figure 2A:
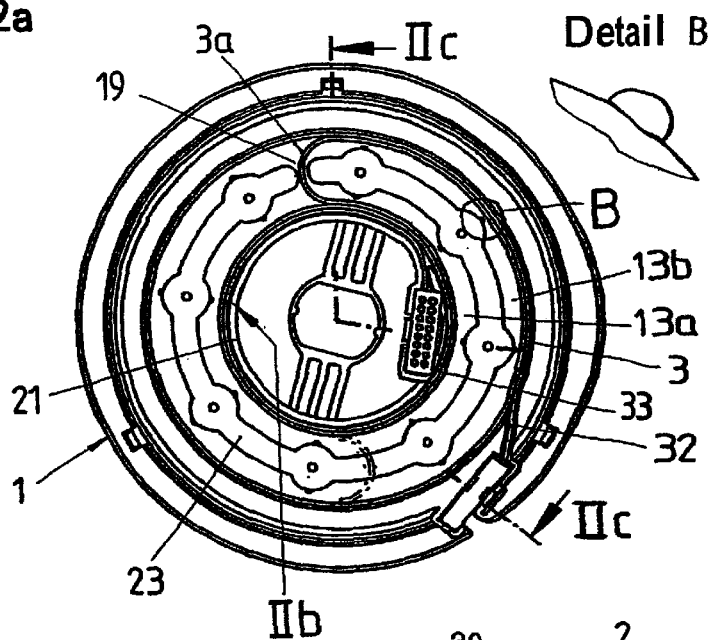

FIG. 2a shows a plan view of a device for transmitting electric current between two components, which can rotate with respect to one another, of a steering device for motor vehicles, having a stator 1 and a rotor 2 according to a further embodiment of the present invention. The basic design is largely the same as that of the device described in FIGS. 1a and 1b, so that the same reference symbols are used for identical components.

The major difference with the present embodiment is that the winding element for the flexible printed circuit 3 is not, as shown in FIG. 1a, in the form of a guide ring which is permanently connected to the stator, but is in the form of a moving winding segment 23. This winding segment 23 is formed in an annular shape in the chamber 13 between the winding surface 21 of the rotor 2 and the intermediate wall 11 of the stator 1. It has a passage 19 for the U-shaped reversing section 3a of the flexible printed circuit 3. The winding segment 23 is arranged in the chamber 13 such that it can rotate freely, so that, when the rotor 2 rotates, the wound-up or unwound flexible printed circuit 3 moves the winding segment 23 with it, in the same rotation sense as the rotor.

Figure 2B:
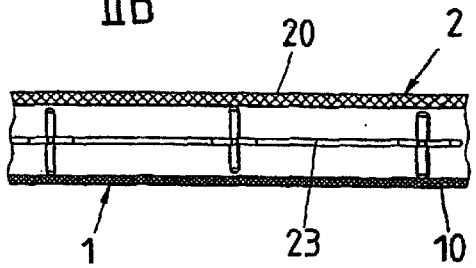

FIG. 2b shows the device based on the partial view oriented in the direction IIb in FIG. 2a. The winding segment 23 has centering devices, which extend in the axial and radial directions, at regular intervals on its circumference. These centering devices extend radially between the flexible printed circuit 3 in the holder 13a and in the holder 13b, and axially between the base surface 20 of the rotor 2 and the base surface 10 of the stator 1. The ends of each of the centering devices are spherical, so that the friction between the winding segment 23 and the base surface 20 of the rotor 2, the base surface 10 of the stator 1 and the flexible printed circuit 3 is reduced. Furthermore, the winding segment 23 is formed such that it has a slight arc shape in the axial direction, so that it is mounted prestressed in the axial direction in the chamber 13. This ensures low-noise axial running, without any play, when the flexible printed circuit 3 is being wound up and unwound.

Figure 2C:
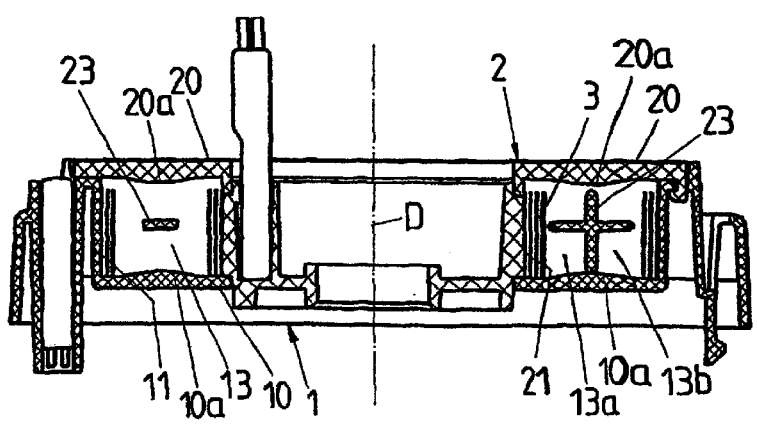

FIG. 2c shows the device in the form of a section along the line IIc—IIc shown in FIG. 2a. Identical components are once again provided with the same reference symbols as in FIG. 1a. The base plate 10 of the stator and the base surface 20 of the rotor 2 have bulges 10a, 20a, oriented toward the chamber 13, in the region of the chamber 13. During rotation of the rotor 2, the u-shaped section 3a of the flexible printed circuit 3 touches the stator 1 and the rotor 2 only in the regions of the peaks of the two bulges 10a, 20a, so that the friction forces between the flexible printed circuit 3 and the stator 1, and between the flexible printed circuit 3 and the rotor 2, are reduced.

Figure 3A:
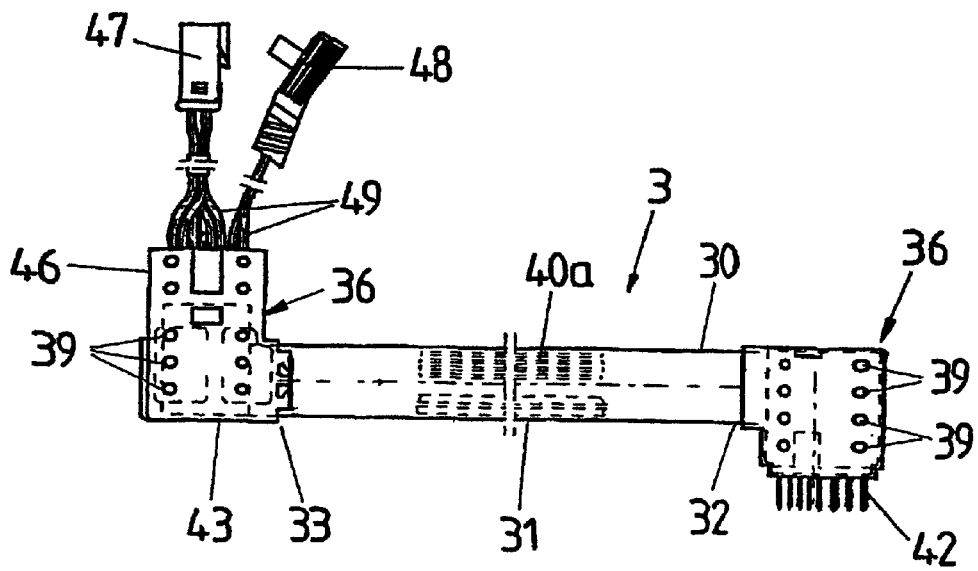

FIG. 3a shows a plan view of a flexible printed circuit 3, on whose longitudinally extended substrate film 30 a large number of conductor tracks 40a run alongside one another. These conductor tracks 40a were produced, for example, by selective etching of a copper layer, which had previously been applied by means of a conventional printed circuit technology method to the front face and rear face of the flexible substrate film 30.

The longitudinally extended central section 31 of the flexible printed circuit 3 can be wound up due to the flexibility of the substrate film 30, so that the flexible printed circuit 3 can be used in a device for transmitting electric current as shown in FIG. 1a.

At its stator end 32, the printed circuit 3 has a reinforced region 36 in the form of a plastic element, and is also provided with electrical contact elements 42, which can make contact with corresponding electrical connections on the stator 1.

At the rotor end 33, the printed circuit 3 has a further reinforced region 36 with a holding section 46.

The reinforced regions 36 also have a number of openings 39, through which the printed circuit 3 can be supported.

Electrical lines 49 lead from the holding section 46 firstly to the plug connector 47, which makes contact with multi-function switches which are arranged in the steering wheel. Switches such as these may, for example, be used to operate windshield wipers, a steering wheel heating device and/or a radio. Further electrical lines 49 lead to the plug connector 48, which makes contact between the trigger apparatus for the gas generator for an airbag unit, which is provided in the steering wheel, and the vehicle electronics.

A second embodiment of a flexible printed circuit is shown in FIG. 3b. In the region of the electrical plug connectors 47, 48 and in the region between the two reinforced regions 31, this printed circuit 3 is identical to that shown in FIG. 3a, with identical reference symbols in each case being used once again for identical components. Reference should therefore be made to the explanatory notes relating to FIG. 3a in this context.

The printed circuit 3 shown in FIG. 3b differs from the printed circuit shown in FIG. 3a in that the reinforced regions 36 comprise three reinforcing elements, which are essentially of the same size and are in the form of small panels. These reinforcing elements are joined together such that they are flush, enclosing the flexible printed circuit 3, which has two substrate films 30, and the electrical conductors 49.

FIG. 3c shows a cross section of the reinforced region 36 along the line IIIc—IIIc shown in FIG. 3b. The central reinforcing element 36b has a cutout in the two surfaces which are joined to the outer reinforcing elements 36a and 36c, into which cutout a respective stator end or rotor end of a flexible substrate film 30 can be fitted, so that the outer reinforcing elements 36b and 36d can be attached in an interlocking manner to the central reinforcing element 36b with the substrate films 30 inserted.

FIG. 3d shows the three reinforcing elements 36a–c, separated from one another, in a plan view of their joining surfaces. As can be seen, the central reinforcing element 36b has guide cutouts 36d, which run at right angles to the direction in which the substrate film extends, in a holding section 46, into which guide cutouts 36d the electrical conductors 49 can be fitted, with the outer reinforcing elements 36a and 36c likewise having guide cutouts 36d in mirror-image form with respect to the respective joining plane, so that the conductors 49 are connected in a force-fitting manner to the reinforcing elements 36a–c where said reinforcing elements 36a–c are joined together such that they are flush. This ensures that strain relief is provided for the electrical contacts between the conductors 49 and the conductor tracks 40a, 40b on the flexible printed circuit 3.

FIG. 4a shows a further embodiment of the flexible printed circuit 3. In this case, the stator end of the printed circuit 3 is shaped such that it is broader, so that the conductor tracks 40a, 40b on the surfaces 28, 29, which face away from one another, end in different regions, which are arranged alongside one another. This in each case allows an electrical contact element 42 to be attached to the conductor tracks 40a and the conductor tracks 40b, without there being any risk of short circuits between the conductor tracks 40a and 40b on those surfaces 28, 29 of the printed circuit 3 which face away from one another.

It can be seen from FIG. 4a that the broader stator end is folded such that the electrical contact elements 42 come to rest one behind the other transversely with respect to the direction in which the printed circuit 3 extends. FIG. 4b shows a cross section of the flexible printed circuit 3 along the line IVb—IVb shown in FIG. 4a. In a plan view, it can be seen from this figure that the respective contact elements 42 of the conductor tracks 40a and 40b are arranged one behind the other, transversely with respect to the direction in which the flexible printed circuit 3 extends, once the stator end of the flexible printed circuit 3 has been folded.

Figure 5A:
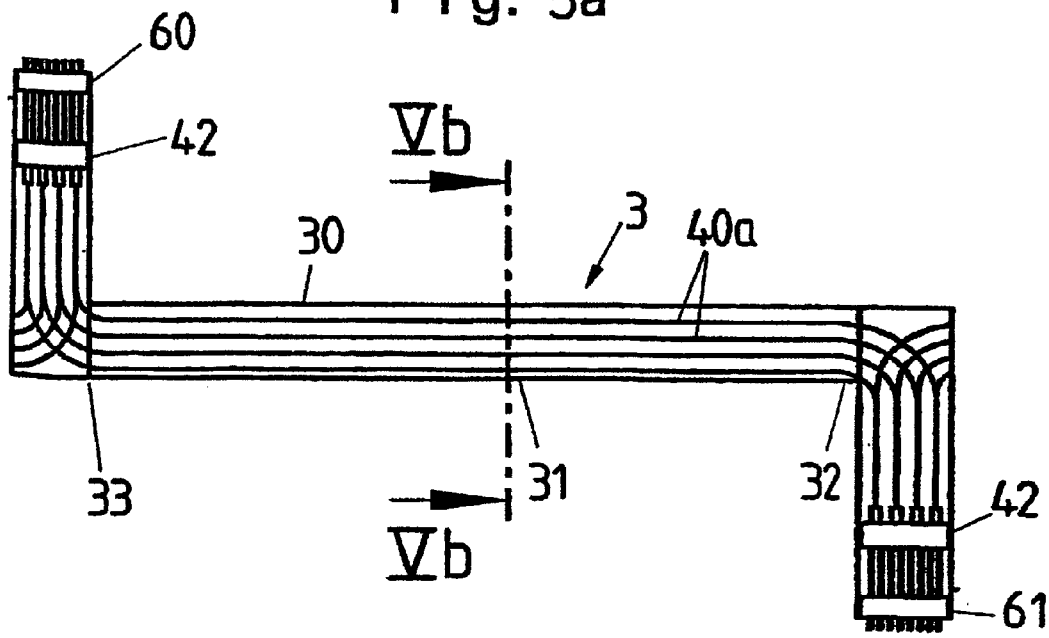

FIG. 5a shows a further embodiment of the flexible printed circuit 3 which, in addition to electrical contact elements 42 at its rotor end 32 and at its stator end 33, in each case has integrated circuits 60, 61, which are associated with the electrical contact elements 42.

Figure 5B:
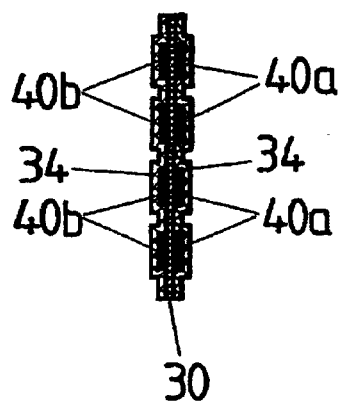

FIG. 5b shows an enlarged cross section of the flexible printed circuit 3, in its central region 31, along the line Vb—Vb shown in FIG. 5a. The configuration of the flexible printed circuit 3 which can be seen in FIG. 5b corresponds essentially to that shown in FIG. 1c. Reference is therefore made here to the corresponding statements relating to FIG. 1c.

Figure 6:
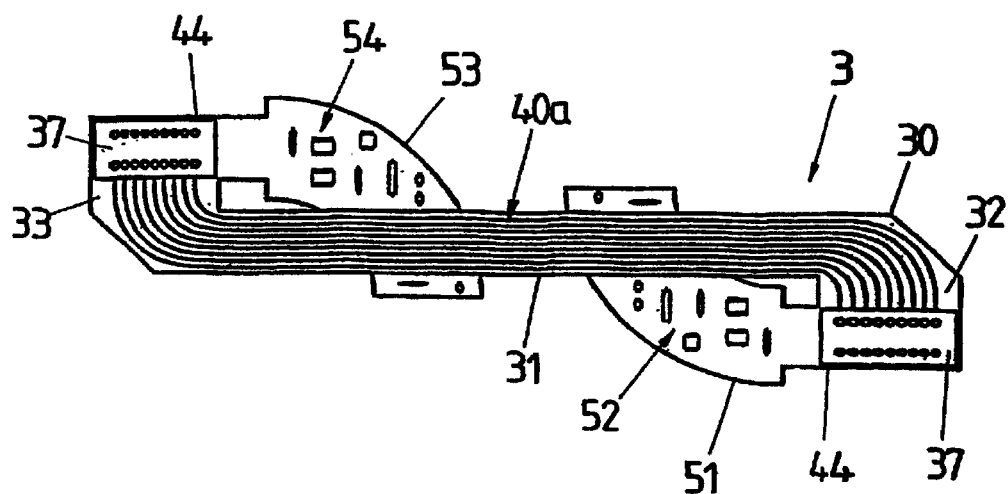

FIG. 6 shows, schematically, a further embodiment of a printed circuit 3, on whose flexible substrate film 30 a number of conductor tracks 40a and 40b run alongside one another, on the front face and rear face. In this case, the conductor tracks 40a and 40b run very close alongside one another in the longitudinally extended central section 31, which can be wound up, of the flexible printed circuit 3. The substrate film 30 can thus be designed to be particularly narrow in this section 31 of the printed circuit 3.

However, the distances between the individual conductor tracks 40a and 40b increase both toward the stator end 32 and toward the rotor end 33, so that the substrate film 30 must be designed to be correspondingly broader in these sections 32, 33. The increase in the distances between the conductor tracks 40a and 40b, which run alongside one another, in the region of the end sections 32, 33 makes it easier to make contact with the conductor tracks 40a and 40b using suitable plug elements 44. In addition, a reinforcing element 37, which is composed of plastic, is in each case provided in the region of the plug elements 44, in order to ensure that the flexible printed circuit 3 is sufficiently robust in the region of the plug elements 44.

Both in the region of its stator end 32 and in the region of its rotor end 33, the flexible printed circuit 3 has a respective projection 51 and 53, on which further electrical components are arranged.

The stator-end projection 51 is in this case used for holding a steering angle sensor, and is thus provided with the electrical components on an electrical evaluation unit 52 for this steering angle sensor. Furthermore, the stator-end electronic assembly 52 on the flexible printed circuit 3 may also include the electronics for the indicator light switch 56 as shown in FIG. 1b.

Electronic assemblies 54 which are arranged on the rotor-end projection 53 of the printed circuit 3 may be used, in particular, to provide electronic control for the trigger device for an airbag unit, or for multifunction switches which are arranged in the region of the steering wheel. Furthermore, it is also possible to code and decode signals by means of the electronic assemblies 52, 54.

According to the exemplary embodiment of the present invention, described above the flexible printed circuit 3 can be used for a large number of other functions in addition to transmitting signal and/or power current from the stator to the rotor of a steering device. This allows the integration level of the electrical and electronic assemblies in the region of the steering device to be increased. It is thus possible to minimize not only the costs for production of these electronic assemblies, but also the amount of space they require.

Figure 7:
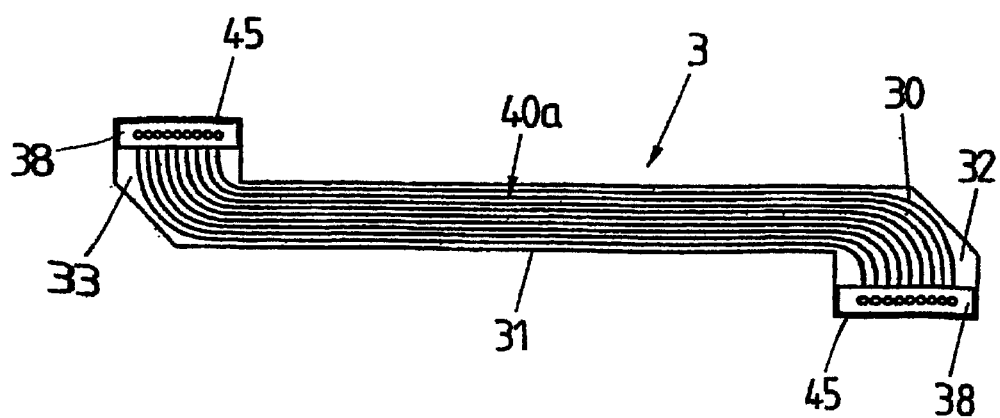

FIG. 7 shows a further embodiment of a flexible printed circuit. In the region between the two plug elements 45, this printed circuit 3 is identical to that shown in FIG. 6, with identical reference symbols once again being used in each case for identical components. Reference is thus made to the explanatory notes relating to FIG. 6 in this context.

The printed circuit 3 shown in FIG. 7 differs from the printed circuit shown in FIG. 6 firstly in that the two plug elements 45 and the associated reinforcing elements 38 at the stator end 32 and at the rotor end 33 of the printed circuit 3 are narrower.

Furthermore, the printed circuit 3 shown in FIG. 7 does not have any projections at its ends for holding further electronic assemblies. The function of this flexible printed circuit 3 is thus restricted to transmitting signal and/or power current between the stator and the rotor.

In comparison to conventional electrical lines which are provided for the connection between the stator and rotor, this flexible printed circuit 3 also has the major advantage that the space required can be minimized. This is because, as already explained with reference to FIG. 6, the capability to design the flexible printed circuit 3 freely at both ends allows it to be designed such that it is particularly narrow in its central section 31 which, in fact and as shown in FIG. 1b, runs between the stator and the rotor of the steering device. The printed circuit 3 is deliberately broadened just at its two end sections 32, 33, in order to allow contact to be made with the conductor tracks 40a and 40b there via plug elements 45.

What is claimed is:

1. A device for transmitting electric current between two components of a steering device for motor vehicles, comprising
   a rotor which is associated with the steering wheel and can rotate together with it,
   a stator, which is associated with a stationary assembly in the motor vehicle, and
   a flexible printed circuit, which runs from the rotor to the stator and is adapted to be wound and unwound on a winding element during rotation of the steering wheel, and which has a flat flexible substrate,
   wherein the flexible substrate has conductor tracks, which run from the stator to the rotor, on each of two surfaces which face away from one another, and wherein an electronic assembly is integrated in the flexible printed circuit at one end and
   wherein signals to be transmitted by the flexible printed circuit are coded and/or decoded by the electronic assembly.

2. The apparatus as claimed in claim 1, wherein the flexible substrate is in the form of a strip.

3. The device as claimed in claim 1, wherein the substrate is in the form of a film, and the conductor tracks comprise thin metal layers.

4. The device as claimed in claim 3, wherein the conductor tracks run along the direction in which the film extends.

5. The device as claimed in claim 1, wherein the conductor tracks have different cross sections.

6. The device as claimed in claim 1, wherein the flexible printed circuit has electrical contact elements that can make contact with at least one associated electrical connection on a stator and on a rotor, and wherein the flexible printed circuit has electrical contact elements which can make contact with connections, at both its stator end and its rotor end.

7. The device as claimed in claim 6, wherein the contact elements comprise plug elements, which can be inserted into the electrical connections of the stator and of the rotor.

8. The device as claimed in claim 6, wherein the contact elements are intended for making contact with electrical connections which are arranged essentially transversely with respect to the direction in which the flexible printed circuit extends.

9. The device as claimed in claim 6, wherein the contact elements are intended for making contact with electrical connections which are arranged essentially parallel to the direction in which the flexible printed circuit extends.

10. The device as claimed in claim 1, wherein the conductor tracks run alongside one another on the flexible substrate so that the distance between the individual conductor tracks increases in the region of the stator end and/or of the rotor end of the printed circuit.

11. The device as claimed in claim 1, wherein the flexible printed circuit has a reinforced region at its stator end and/or at its rotor end, in the region of the electrical contact elements.

12. The device as claimed in claim 11, wherein the reinforced region is formed by at least one plastic element, which is molded or clipped onto the flexible printed circuit.

13. The device as claimed in claim 11, wherein the lines are provided, which run from the contact elements to the conductor tracks, and wherein a mechanism is provided in order to divert tensile forces, which act on the lines, into a holding section for the lines are connected to the conductor tracks.

14. The device as claimed in claim 13, wherein the holding section for the lines is part of the reinforced region.

15. The device as claimed in claim 13, wherein the holding section has a number of guide cutouts in which the lines are held with a force fit.

16. The device as claimed in claim 15, wherein the guide cutouts run essentially at right angles to the direction in which the flexible printed circuit extends.

17. The device as claimed in claim 15, wherein the guide cutouts run essentially parallel to the direction in which the flexible printed circuit extends.

18. The device as claimed in claim 11, wherein the reinforced region has at least two reinforcing elements, which hold a flexible printed circuit between them.

19. The device as claimed in claim 18, wherein the reinforced region can be folded up in order to fit or remove a flexible printed circuit.

20. The device as claimed in claim 19, wherein the reinforcing elements have a film hinge for the folding connection.

21. The device as claimed in claim 18, wherein the reinforced region comprises three reinforcing elements.

22. The device as claimed in claim 1, wherein the conductor tracks each have a separate associated electrical contact element at the rotor end and/or at the stator end of the flexible printed circuit, on each of the two surfaces of the flexible substrate.

23. The device as claimed in claim 22, wherein the electrical contact elements are arranged on the flexible substrate at the rotor end and/or at the stator end of the flexible printed circuit, and wherein the flexible substrate is folded at the respective end so that the electrical contact elements are arranged one behind the other, transversely to the direction in which the flexible printed circuit extends.

24. The device as claimed in claim 1, wherein the flexible printed circuit is connected via latching elements at its ends to the stator and/or to the rotor.

25. The device as claimed in claim 1, wherein each end of the flexible printed circuit is adhesively bonded to the stator and/or to the rotor at its ends.

26. The device as claimed in claim 1, further comprising a steering angle sensor at the stator end.

27. The device as claimed in claim 26, wherein an electronic evaluation unit, which is associated with the steering angle sensor, is integrated in the flexible printed circuit.

28. The device as claimed in claim 1, further comprising an electronic assembly for controlling steering wheel heating, wherein the assembly is integrated in the flexible printed circuit.

29. The device as claimed in claim 1, wherein an electronics unit which is coupled to electrical components on the steering wheel side, and is integrated in the rotor end of the flexible printed circuit.

30. The device as claimed in claim 1, wherein the flexible printed circuit has integrated circuits for coding and/or decoding signals to be transmitted.

31. The device as claimed in claim 2, wherein the stator and the rotor form an inner and an outer housing element, which can rotate with respect to one another, with the stator surrounding the rotor in an annular shape, and the winding element for the flexible printed circuit being a component of the rotor.

32. The device as claimed in claim 1, wherein the flexible printed circuit has at least one section along which the direction in which the flexible printed circuit extends.

33. The device as claimed in claim 32, wherein an annular guide for the flexible printed circuit is provided between the stator and the rotor, and extends, preferably as an annular guide, between the stator and the rotor.

34. The device as claimed in claim 33, wherein the guide between the stator and the rotor forms a first holder for the wound-up part of the flexible printed circuit, and a second holder for the unwound part of the flexible printed circuit.

35. The device as claimed in claim 1, wherein the stator is intended to hold at least one control switch, which is associated with an electronic assembly on the flexible printed circuit.

* * * * *